(12) United States Patent
Chae

(10) Patent No.: US 11,538,784 B2
(45) Date of Patent: Dec. 27, 2022

(54) LIGHT EMITTING DEVICE HAVING CANTILEVER ELECTRODE, LED DISPLAY PANEL AND LED DISPLAY APPARATUS HAVING THE SAME

(71) Applicant: SEOUL VIOSYS CO., LTD., Ansan-si (KR)

(72) Inventor: Jong Hyeon Chae, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 124 days.

(21) Appl. No.: 16/877,258

(22) Filed: May 18, 2020

(65) Prior Publication Data

US 2020/0381386 A1 Dec. 3, 2020

Related U.S. Application Data

(60) Provisional application No. 62/854,257, filed on May 29, 2019.

(51) Int. Cl.
*H01L 23/00* (2006.01)
*H01L 33/62* (2010.01)
*H01L 25/075* (2006.01)

(52) U.S. Cl.
CPC .......... *H01L 24/72* (2013.01); *H01L 25/0753* (2013.01); *H01L 33/62* (2013.01)

(58) Field of Classification Search
CPC ..... H01L 24/72; H01L 25/0753; H01L 33/62; H01L 2224/0401; H01L 2224/05599; H01L 2224/13082; H01L 2224/13083; H01L 2224/13124; H01L 2224/13144; H01L 2224/13147; H01L 2224/13155; H01L 2224/13157; H01L 2224/13169; H01L 24/11; H01L 24/29; H01L 24/81; H01L 24/83; H01L 24/95; H01L 2224/11001; H01L 2224/11005; H01L 2224/1301; H01L 2224/13016; H01L 2224/13166; H01L 2224/13171; H01L 2224/13184; H01L 2224/1412; H01L 2224/29186; H01L 2224/2919; H01L 2224/29193;

(Continued)

(56) References Cited

U.S. PATENT DOCUMENTS

| 7,804,382 B2 | 9/2010 | Shin et al. |
| 2011/0249109 A1* | 10/2011 | Fine .................. G01N 21/6408 348/79 |

(Continued)

FOREIGN PATENT DOCUMENTS

| JP | 10-291338 | 11/1998 |
| JP | 2019-079985 | 5/2019 |
| KR | 10-1378510 | 3/2014 |

OTHER PUBLICATIONS

International Search Report dated Sep. 16, 2020, issued in International Patent Application No. PCT/KR2020/006793.

*Primary Examiner* — Elias Ullah
(74) *Attorney, Agent, or Firm* — H.C. Park & Associates, PLC

(57) ABSTRACT

A light emitting device including at least one LED stack, electrode pads disposed on the LED stack, and cantilever electrodes disposed on the electrode pads, respectively, in which each of the cantilever electrodes has a fixed edge that is fixed to one of the electrode pads and a free standing edge that is spaced apart from the one of the electrode pads.

20 Claims, 6 Drawing Sheets

(58) Field of Classification Search
CPC . H01L 2224/29199; H01L 2224/29299; H01L 2224/73204; H01L 2224/81001; H01L 2224/81022; H01L 2224/81399; H01L 2224/81903; H01L 2224/83001; H01L 2224/83192; H01L 2224/83399; H01L 2224/83851; H01L 2224/83862; H01L 2224/83874; H01L 2224/95001; H01L 2924/12041; H01L 24/13
See application file for complete search history.

(56) References Cited

U.S. PATENT DOCUMENTS

| | | |
|---|---|---|
| 2012/0231572 A1 | 9/2012 | Or-Bach et al. |
| 2017/0146510 A1* | 5/2017 | Ikeda ............... G01N 33/48721 |
| 2019/0097088 A1 | 3/2019 | Huppmann et al. |
| 2019/0333901 A1* | 10/2019 | Cok ................... H01L 21/6835 |
| 2020/0090569 A1* | 3/2020 | Hajati .................... G06F 3/012 |
| 2020/0243739 A1 | 7/2020 | Fukaya et al. |

* cited by examiner

LIGHT EMITTING DEVICE HAVING CANTILEVER ELECTRODE, LED DISPLAY PANEL AND LED DISPLAY APPARATUS HAVING THE SAME

CROSS-REFERENCE TO RELATED APPLICATION

This application claims the benefit of U.S. Provisional Application No. 62/854,257, filed on May 29, 2019, which is hereby incorporated by reference for all purposes as if fully set forth herein.

BACKGROUND

Field

Exemplary embodiments relate to an LED display panel, an LED display apparatus having the same, and a method of manufacturing the same.

DISCUSSION OF THE BACKGROUND

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. Recently, LED displays that directly display images using the light emitting diodes have been developed.

In general, a display apparatus realizes various colors through mixture of blue, green, and red light. In order to realize various images, a display apparatus generally includes a plurality of pixels, each including sub-pixels corresponding to blue, green, and red light, respectively. As such, a color of a certain pixel is determined based on the colors of the sub-pixels so that images can be realized through combination of such pixels.

Since LEDs can emit various colors depending upon materials thereof, it is possible to provide a display apparatus by arranging individual LED chips emitting blue, green, and red light on a two-dimensional plane.

LEDs used in a conventional large-sized electronic display are typically manufactured in packages, and the LED packages are arranged in units of pixels and individual packages are mounted on a circuit board. However, a display of a small electronic product, such as a smart watch or a mobile phone, a VR headset, or AR glasses, or a display such as TV may employ micro LEDs that have a smaller size than those in a conventional LED package to realize clear image quality.

Since small-sized LEDs are difficult to handle, it is difficult to mount the small-sized LEDs individually on a circuit board. As such, a method of forming a plurality of LEDs using semiconductor layers that are grown on a substrate and transferring the LEDs onto a display circuit board in a group at pixel intervals has been studied. However, transferring the plurality of LEDs in a group may cause a failure in some of the LEDs. In particular, due to a difference in thermal expansion coefficients between the display circuit board and a support substrate supporting the LEDs, each of the LEDs being transferred may not be electrically connected to pads on the display circuit board. In this case, replacing the defective LEDs individually with good LEDs is very difficult due to the small size of the LEDs. Accordingly, there is a need for a display apparatus where LEDs that are transferred in a group to the circuit board can be safely transferred without causing a failure.

Meanwhile, since the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, thereby deteriorating the brightness of the pixels.

The above information disclosed in this Background section is only for understanding of the background of the inventive concepts, and, therefore, it may contain information that does not constitute prior art.

SUMMARY

Light emitting devices constructed according to exemplary embodiments of the invention are capable of being transferred onto a circuit board in a group.

Exemplary embodiments also provide an LED display panel where a plurality of light emitting devices can be safely transferred onto a circuit board, and a display apparatus having the same.

Exemplary embodiments further provide an LED display panel where electrical connection between light emitting devices and pads of a circuit board can be consolidated, and a display apparatus having the same.

Exemplary embodiments still provide a method of safely transferring a light emitting device for a display that is capable of increasing an area of each sub-pixel in a restricted pixel area, and a display apparatus including the same.

Additional features of the inventive concepts will be set forth in the description which follows, and in part will be apparent from the description, or may be learned by practice of the inventive concepts.

A light emitting device according to an exemplary embodiment includes at least one LED stack, electrode pads disposed on the LED stack, and cantilever electrodes disposed on the electrode pads, respectively, in which each of the cantilever electrodes has a fixed edge that is fixed to one of the electrode pads and a free standing edge that is spaced apart from the one of the electrode pads.

The free standing edge of the cantilever electrode may be bent in a direction away from the at least one LED stack.

The cantilever electrode may include at least two metal layers having different thermal expansion coefficients from each other.

The at least one LED stack may include a first LED stack, a second LED stack, and a third LED stack, a first bonding layer interposed between the first LED stack and the second LED stack, and a second bonding layer interposed between the second LED stack and the third LED stack, the first, second, and third LED stacks may be configured to emit light having different wavelengths, and the electrode pads may be electrically connected to the first, second, and third LED stacks to individually drive the first, second, and third LED stacks.

The light emitting device may have a width of about 10 μm or less.

A display panel according to another exemplary embodiment includes a circuit board having pads, light emitting devices electrically connected to the pads and arranged on the circuit board, and an adhesive layer disposed between the circuit board and the light emitting devices to adhere the circuit board and the light emitting devices, in which each of the light emitting devices includes at least one LED stack, electrode pads disposed on the LED stack, and cantilever electrodes disposed on the electrode pads, respectively, each of the cantilever electrodes has a fixed edge that is fixed to one of the electrode pads and a free standing edge that is spaced from the one of the electrode pads, and the free standing edge is electrically connected to one of the pads of the circuit board.

The light emitting devices may be disposed at a pitch of about 50 μm or less.

The light emitting devices may be disposed at a pitch of about 10 μm or less.

At least one free standing edge of the cantilever electrodes may extend outwardly beyond an area of the at least one LED stack.

The cantilever electrode may include at least two metal layers having different thermal expansion coefficients from each other.

The metal layers may include at least one of Ni, Co, Cu, Ti, Al, Ti, and Pt.

The at least one LED stack may include a first LED stack, a second LED stack, and a third LED stack, a first bonding layer interposed between the first LED stack and the second LED stack, and a second bonding layer interposed between the second LED stack and the third LED stack, the first, second, and third LED stacks may be configured emit light having different wavelengths, and the electrode pads may be electrically connected to the first, second, and third LED stacks to individually drive the first, second, and third LED stacks.

The light emitting devices may be configured to emit light generated from the first, second, and third LED stacks through the third LED stack.

The third LED may not include a growth substrate.

The adhesive layer may partially cover a side surface of the light emitting device.

The adhesive layer may include a curable resin.

A display apparatus according to still another exemplary embodiment includes a display panel including a circuit board having pads, light emitting devices electrically connected to the pads and arranged on the circuit board, and an adhesive layer disposed between the circuit board and the light emitting devices to adhere the circuit board and the light emitting devices, in which each of the light emitting devices includes at least one LED stack, electrode pads disposed on the LED stack, and cantilever electrodes disposed on the electrode pads, respectively, each of the cantilever electrodes has a fixed edge that is fixed to one of the electrode pads and a free standing edge that is spaced from the one of the electrode pads, and the free standing edge is electrically connected to one of the pads of the circuit board.

The light emitting devices may be disposed at a pitch of about 10 μm or less.

Each of the cantilever electrodes may include at least two metal layers having different thermal expansion coefficients from each other.

Each of the light emitting devices may include a first LED stack, a second LED stack, and a third LED stack, the first, second, and third LED stacks may be configured to emit light having different wavelengths, and the light emitting devices may be configured to emit light generated from the first, second, and third LED stacks through the third LED stack.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
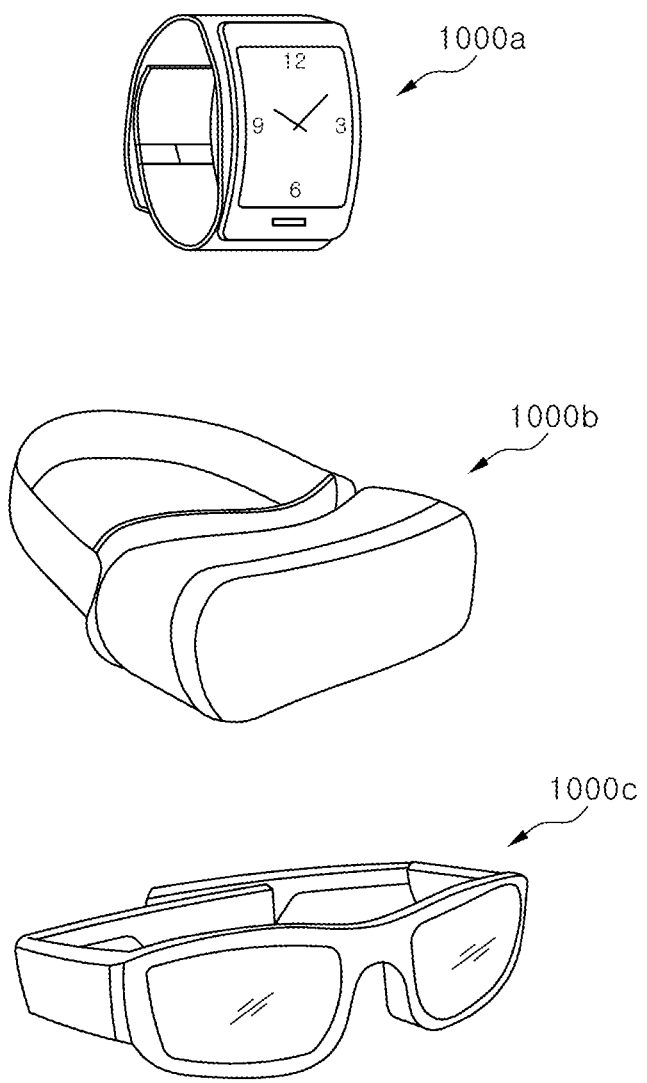
FIG. 1 shows schematic perspective views of display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting device according to an exemplary embodiment includes: at least one LED stack; electrode pads disposed on the LED stack; and cantilever electrodes disposed on the electrode pads, respectively, in which each of the cantilever electrodes has a fixed edge fixed to the electrode pad and a free standing edge spaced apart from the electrode pad.

The free standing edge of the cantilever electrode may be bent in a direction that is away from the at least one LED stack. As such, the free standing edge may provide a sharp point, and a stable electrical connection may be achieved through the sharp point of the free standing edge.

Moreover, the cantilever electrode may include at least two metal layers having different thermal expansion coefficients. A difference in thermal expansion coefficients of the metal layers may be used to cause bending of the cantilever electrode.

The light emitting device may include: a first LED stack; a second LED stack; a third LED stack; a first bonding layer interposed between the first LED stack and the second LED stack; and a second bonding layer interposed between the second LED stack and the third LED stack, in which the first, second, and third LED stacks may emit light of different wavelengths, and the electrode pads may be electrically connected to the first, second, and third LED stacks to individually drive the first, second, and third LED stacks.

The light emitting device may have a maximum width of 100 µm or less, and further, 50 µm or less, particularly 10 µm or less. A light emitting device having a small width of 10 µm or less is difficult to be transferred to the circuit board using a conventional solder or bump pad. The cantilever electrode according to the exemplary embodiment may facilitate transferring small-sized light emitting devices in a group, in particular.

A display panel according to an exemplary embodiment includes: a circuit board having pads; light emitting devices electrically connected to the pads and arranged on the circuit board; and an adhesive layer disposed between the circuit board and the light emitting devices to adhere the circuit board and the light emitting devices, in which each of the light emitting devices includes at least one LED stack; electrode pads disposed on the LED stack; and cantilever electrodes disposed on the electrode pads, respectively, in which each of the cantilever electrodes has a fixed edge fixed to the electrode pad and a free standing edge spaced from the electrode pad, and the free standing edge is electrically connected to the pad of the circuit board.

The light emitting devices may be disposed at a pitch of 100 µm or less, and further, a pitch of 50 µm or less, in particular, a pitch of 10 µm or less.

In some exemplary embodiments, at least one free standing edge among those of the cantilever electrodes may extend outwardly to an area of the at least one LED stack. In another exemplary embodiment, the cantilever electrodes may be disposed in the region of the at least one LED stack.

In one exemplary embodiment, the cantilever electrode may include at least two metal layers having different thermal expansion coefficients from each other. A difference in thermal expansion coefficients of the metal layers may be used to cause bending of the cantilever electrode.

The metal layers may be selected from, for example, Ni, Co, Cu, Ti, Al, Ti, or Pt, but the metal layers of the present disclosure are not limited thereto.

The light emitting device may include: a first LED stack; a second LED stack; a third LED stack; a first bonding layer interposed between the first LED stack and the second LED stack; and a second bonding layer interposed between the second LED stack and the third LED stack, in which the first, second, and third LED stacks may emit light of different wavelengths, and the electrode pads may be electrically connected to the first, second, and third LED stacks to individually drive the first, second, and third LED stacks.

The light emitting devices may emit light generated from the first, second, and third LED stacks through the third LED stack.

The third LED stack may be separated from a growth substrate. More particularly, the light emitting device may not include a growth substrate which has been used to grow the third LED stack.

The adhesive layer may partially cover a side surface of the light emitting device. In addition, the adhesive layer may be formed of curable resin.

A display apparatus according to an exemplary embodiment includes: a display panel, in which the display panel includes: a circuit board having pads; light emitting devices electrically connected to the pads and arranged on the circuit board; and an adhesive layer disposed between the circuit board and the light emitting devices to bond the circuit board and the light emitting devices, in which each of the light emitting devices includes at least one LED stack; electrode pads disposed on the LED stack; and cantilever electrodes disposed on the electrode pads, respectively, in which each of the cantilever electrodes has a fixed edge fixed to the electrode pad and a free standing edge spaced from the electrode pad, and the free standing edge is electrically connected to the pad of the circuit board.

The light emitting devices may be disposed at a pitch of 100 µm or less, and further, a pitch of 50 µm or less, in particular, a pitch of 10 µm or less.

Each of the cantilever electrodes may include at least two metal layers having different thermal expansion coefficients from each other.

Each of the light emitting devices may include a first LED stack, a second LED stack, and a third LED stack, in which the first, second, and third LED stacks may emit light of different wavelengths, and the light emitting devices may emit light generated from the first, second, and third LED stacks through the third LED stack.

FIG. 1 shows schematic perspective views of display apparatuses according to exemplary embodiments.

The light emitting device according to exemplary embodiments may be used in a VR display apparatus, such as a smart watch 1000a or a VR headset 1000b, or an AR display apparatus, such as augmented reality glasses 1000c, without being limited thereto. The AR display apparatus may have a very narrow interval between pixels of about 10 µm, and the light emitting device according to the exemplary embodiments may be suitable in a display apparatus having such narrow pitch pixels. However, the inventive concepts are not limited thereto, and in some exemplary embodiments, the light emitting device according to exemplary embodiments may be applied to a display apparatus having pixels having a relatively wide pitch.

Figure 2:
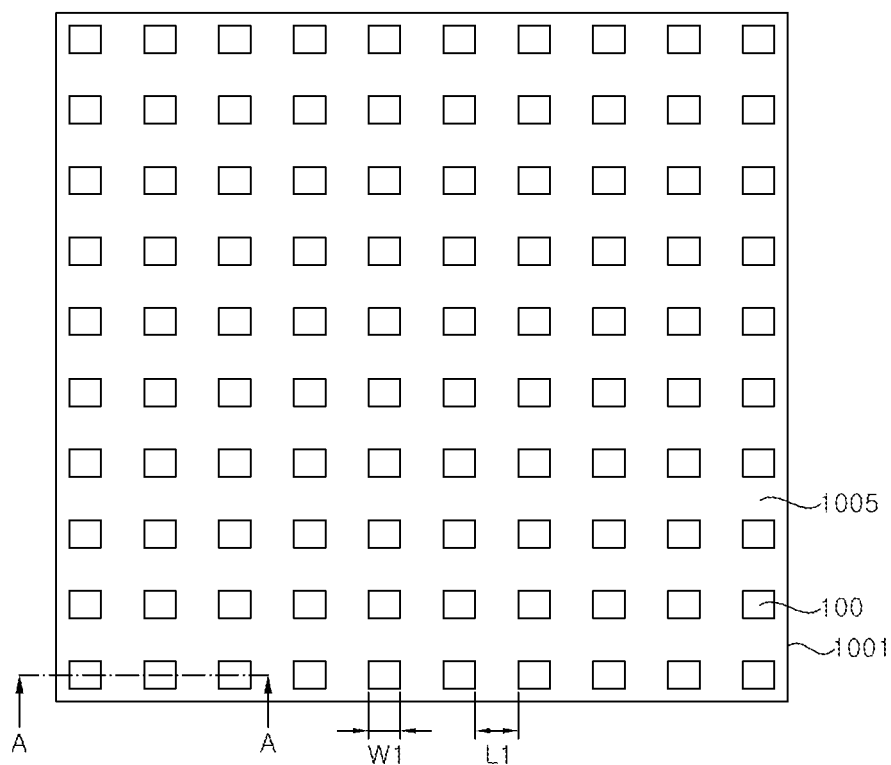
FIG. 2 is a schematic plan view illustrating a display panel according to an exemplary embodiment.

A display panel for displaying an image is mounted on the display apparatus. FIG. 2 is a schematic plan view illustrating a display panel 1000 according to an exemplary embodiment, and FIG. 3 is a cross-sectional view taken along line A-A of FIG. 2.

Figure 3:
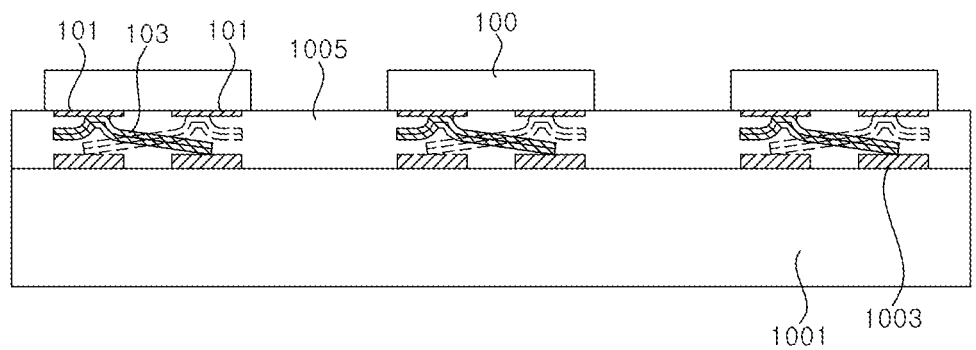
FIG. 3 is a schematic enlarged cross-sectional view taken along line A-A of FIG. 2.

Referring to FIGS. 2 and 3, the display panel includes a circuit board 1001, light emitting devices 100, and an adhesive layer 1005.

The circuit board 1001 (or a panel board) may include a circuit for passive matrix driving or active matrix driving. In an exemplary embodiment, the circuit board 1001 may include interconnection lines and resistors therein. In another exemplary embodiment, the circuit board 1001 may include interconnection lines, transistors, and capacitors. The circuit board 1001 may also have pads 1003 on an upper surface thereof for electrical connection to a circuit disposed therein.

A plurality of light emitting devices 100 is arranged on the circuit board 1001. The light emitting devices 100 may be small-sized light emitting devices having a micro-unit size. For example, a width W1 of the light emitting device 100 may be about 100 µm or less. In some exemplary embodiments, the width W1 may be about 50 µm or less, or about 10 µm or less. The light emitting devices 100 may have a size of, for example, about 100 µm×100 µm or less, and further, about 10 µm×10 µm or less. In an exemplary embodiment, an interval L1 between the light emitting devices 100 in a direction in which the light emitting devices 100 are arranged may be wider than the width W1 of the light emitting device 100 in the same direction. However, the inventive concepts are not limited thereto, and in some exemplary embodiments, the interval L1 may be narrower than the width W1 of the light emitting device 100. A pitch between adjacent light emitting devices 100 may be defined as a sum of the width W1 and the interval L1. The pitch of the light emitting devices 100 may be about 100 µm or less, and further, about 50 µm or less, particularly about 10 µm or less.

The light emitting device 100 may have electrode pads 101 and cantilever electrodes 103, and the cantilever electrodes 103 may be electrically connected to pads 1003 on the circuit board 1001. For example, the cantilever electrode 103 has a free standing edge, and the free standing edge may be electrically connected to the pads 1003 exposed on the circuit board 1001.

The electrode pads 101 may have the same size as one another, or may have different sizes from one another. The electrode pads 101 have a relatively large area, and the cantilever electrodes 103 may be formed on the electrode pads 101, respectively.

The adhesive layer 1005 adheres the light emitting devices 100 to the circuit board 1001. The adhesive layer 1005 is disposed between the light emitting devices 100 and the circuit board 1001 to prevent the cantilever electrodes 103 from being separated from the pads 1003 of the circuit board 1001. Furthermore, the adhesive layer 1005 may cover the circuit board 1001 in a region between the light emitting devices 100.

The adhesive layer 1005 may cover the cantilever electrodes 103 and the electrode pads 101, and may contact a lower surface of the light emitting device 100. An upper surface of the adhesive layer 1005 is generally located under an upper surface of the light emitting device 100. In some exemplary embodiments, a portion of the adhesive layer 1005 may partially cover a side surface of the light emitting device 100.

The adhesive layer 1005 may include various adhesive materials. For example, the adhesive layer 1005 may be formed of thermal curing or ultraviolet curing adhesive. The adhesive layer 1005 may also be formed of a material that is transparent to light, but the inventive concepts are not limited thereto. For example, in some exemplary embodiments, the adhesive layer 1005 may reflect light or absorb light, and in this case, a light reflective material or a light absorbing material may be included in the adhesive layer 1005. For example, a light absorbing material such as carbon black or a light scattering material such as silica may be included in the adhesive layer 1005. In some exemplary embodiments, the adhesive layer 1005 may include an anisotropic conductive film (ACF) material.

In some exemplary embodiments, a light blocking material layer may be disposed in the region between the light emitting devices 100. The light blocking material layer absorbs or reflects light, and thus, prevents light interference between light emitting devices 100, thereby improving a contrast ratio of the display panel.

In an exemplary embodiment, each of the light emitting devices 100 may constitute one pixel. For example, each of light emitting devices 100 may include blue, green, and red sub-pixels.

Figure 4A:
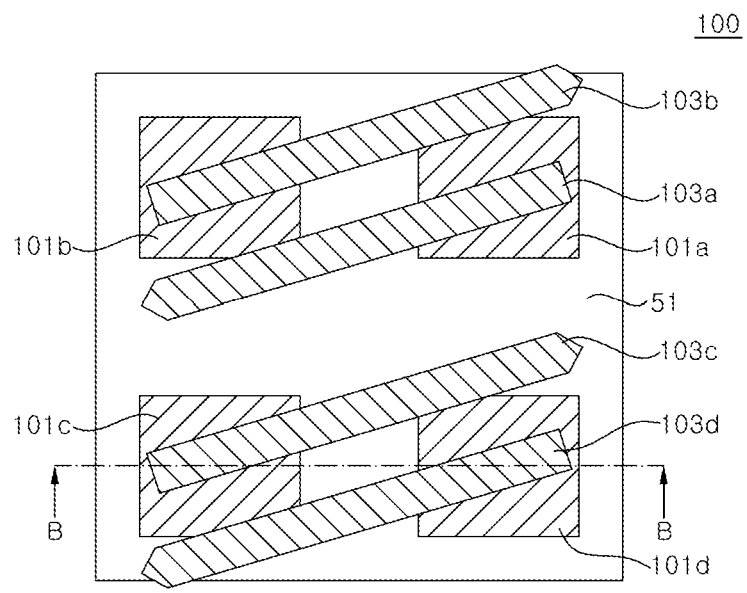
FIG. 4A is a schematic plan view illustrating a light emitting device according to an exemplary embodiment.
Figure 4B:
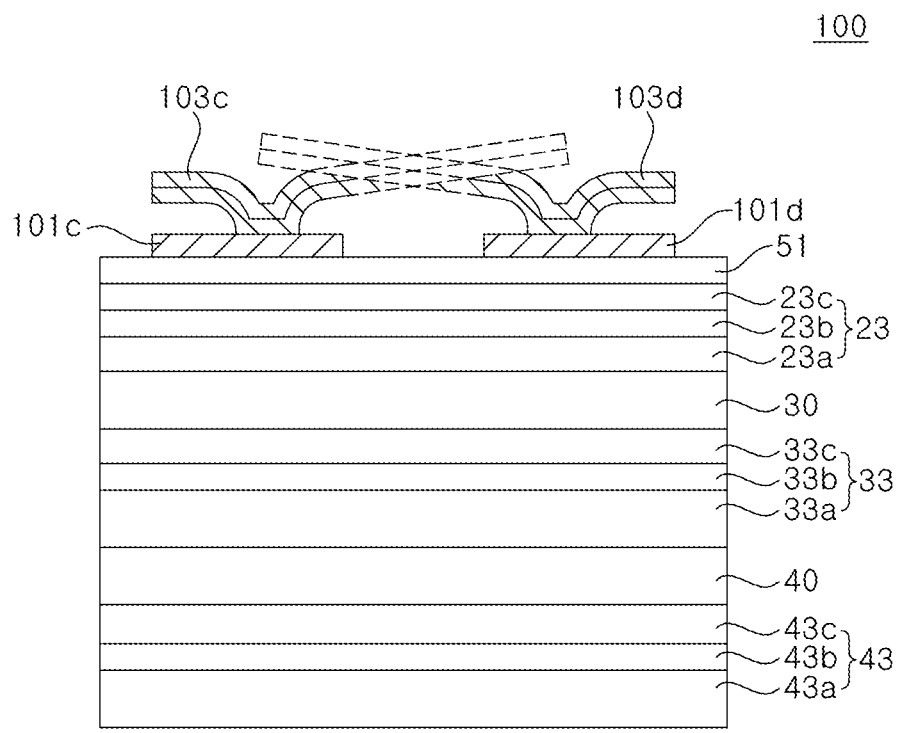
FIG. 4B is a schematic cross-sectional view taken along line B-B of FIG. 4A according to an exemplary embodiment.
Figure 5:
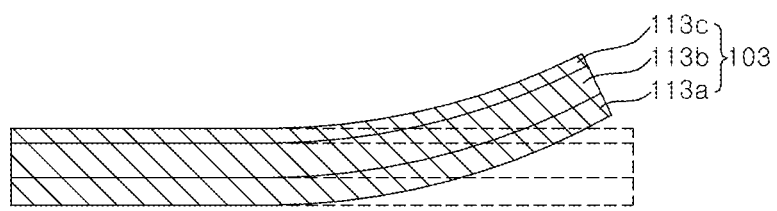
FIG. 5 is a schematic cross-sectional view illustrating a cantilever electrode of a light emitting device according to an exemplary embodiment.
Figure 6:
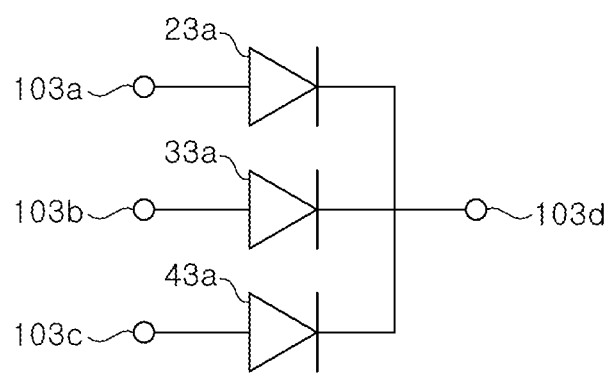
FIG. 6 is a schematic circuit diagram of a light emitting device according to an exemplary embodiment.

A configuration of the light emitting device 100 will be described with reference to FIGS. 4A, 4B, 5, and 6. FIG. 4A and FIG. 4B are a schematic plan view and a schematic cross-sectional view illustrating a light emitting device 100 according to an exemplary embodiment, FIG. 5 is a schematic cross-sectional view illustrating a cantilever electrode 103 of the light emitting device 100 according to an exemplary embodiment, and FIG. 6 is a schematic circuit diagram of the light emitting device 100 according to an exemplary embodiment. Hereinafter, although the cantilever electrodes 103 (103a, 103b, 103c, and 103d) are exemplarily illustrated and described as being disposed at an upper side in FIGS. 4A and 4B, the inventive concepts are not limited thereto. For example, in some exemplary embodiments, the light emitting device 100 may be flip-bonded on the circuit board 1001 as shown in FIG. 3, and in this case, the cantilever electrodes 103 (103a, 103b, 103c, and 103d) may be disposed at a lower side.

Referring to FIGS. 4A and 4B, the light emitting device 100 may include a first LED stack 23, a second LED stack 33, a third LED stack 43, and a first bonding layer 30, a second bonding layer 40, a first insulation layer 51, electrode pads 101a, 101b, 101c, and 101d, and cantilever electrodes 103 (103a, 103b, 103c, and 103d).

The first, second, and third LED stacks 23, 33, and 43 may include semiconductor layers grown on different growth substrates from one another, respectively. According to the illustrated exemplary embodiment, each of the growth substrates may be removed from the first, second, and third LED stacks 23, 33, and 43. As such, the light emitting device 100 may not include the substrates that were used to grow the first, second, and third LED stacks 23, 33, and 43. However, the inventive concepts are not limited thereto, and in some exemplary embodiments, at least one growth substrate may be retained in the light emitting device 100.

In an exemplary embodiment, the first, second, and third LED stacks 23, 33, and 43 are stacked in the vertical direction. The first LED stack 23, the second LED stack 33, and the third LED stack 43 include a first conductivity type semiconductor layer 23a, 33a, or 43a, a second conductivity type semiconductor layer 23c, 33c, or 43c, and active layers 23b, 33b, and 43b interposed therebetween, respectively. The active layers 23b, 33b, and 43b may have multiple quantum well structures, for example.

The second LED stack 33 is disposed under the first LED stack 23, and the third LED stack 43 is disposed under the second LED stack 33. Although the second LED stack 33 is described as being disposed under the first LED stack 23, and the third LED stack 43 is described as being disposed under the second LED stack 33, however, in some exemplary embodiments, the light emitting device may be flip-bonded. In this case, upper and lower positions of the first, second, and third LED stacks may be reversed.

Light generated in the first, second, and third LED stacks 23, 33, and 43 may be emitted to the outside through the third LED stack 43. Accordingly, the first LED stack 23 emits light having a longer wavelength than those emitted from the second and third LED stacks 33 and 43, and the second LED stack 33 emits light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode to emitting blue light. For example, the first LED stack 23 may include an AlGaInP-based well layer, the second LED stack 33 may include an AlGaInP or AlGaInN-based well layer, and the third LED stack 43 may include an AlGaInN-based well layer.

Since the first LED stack 23 emits light having the longer wavelength than those of the second and third LED stacks 33 and 43, light generated from the first LED stack 23 may be emitted to the outside after passing through the second and third LED stacks 33 and 43. In addition, since the second LED stack 33 emits light having a longer wavelength than that of the third LED stack 43, light generated from the second LED stack 33 may be emitted to the outside after passing through the third LED stack 43.

In some exemplary embodiments, while light generated in the first, second, and third LED stacks 23, 33, and 43 may be emitted to the outside through the third LED stack 43, at least one of the first, second, and third LED stacks 23, 33, and 43 may emit light having a shorter wavelength than that emitted from the LED stack disposed thereunder along the path of light. For example, the first LED stack 23 may be an inorganic light emitting diode emitting red light, the second LED stack 33 may be an inorganic light emitting diode emitting blue light, and the third LED stack 43 may be an inorganic light emitting diode to emitting green light. In still another exemplary embodiment, the light emitting device 100 may include two, or four or more LED stacks. In this case, each of the LED stacks may emit light having a wavelength different from each other, or at least two of the LED stacks may emit light having substantially the wavelength. Hereinafter, the light emitting device 100 will exemplarily be described as including the first, second, and third LED stacks 23, 33, and 43 emitting red light, green light, and blue light, respectively.

According to the illustrated exemplary embodiment, the first conductivity type semiconductor layer 23a, 33a, or 43a of each of the LED stacks 23, 33, and 43 may be an n-type semiconductor layer, and the second conductivity type semiconductor layer 23b, 33b, or 43b thereof may be a p-type semiconductor layer. In addition, according to the illustrated exemplary embodiment, although each of the first, second, and third LED stacks 23, 33, and 43 is shown as having the first conductivity type semiconductor layer on the bottom, and the second conductivity type semiconductor layer on the top, in some exemplary embodiments, at least one stacked sequence of the LED stacks may be reversed. For example, the upper surface of the first LED stack 23 may have the first conductivity type semiconductor layer 23a, and the upper surfaces of the second LED stack 33 and the third LED stack 43 may have the second conductivity type semiconductor layers 33c and 43c.

The first LED stack 23, the second LED stack 33, and the third LED stack 43 according to the illustrated exemplary embodiment are stacked to overlap one another. In addition, as shown in the drawing, the first LED stack 23, the second LED stack 33, and the third LED stack 43 may have substantially the same luminous area. However, the first and second LED stacks 23 and 33 may have through holes for allowing electrical connection, and accordingly, the luminous areas of the first LED stack 23 and the second LED stack 33 may be smaller than that of the third LED stack 43.

The first bonding layer 30 couples the first LED stack 23 to the second LED stack 33. The first bonding layer 30 may be disposed between the first conductivity type semiconductor layer 23a and the second conductivity type semiconductor layer 33c. The first bonding layer 30 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 30 may be formed of spin-on-glass (SOG).

The second bonding layer 40 couples the second LED stack 33 to the third LED stack 43. As shown in the drawing, the second bonding layer 40 may be disposed between the first conductivity type semiconductor layer 33a and the second conductivity type semiconductor layer 43c. The second bonding layer 40 may include substantially the same material as that described for the first bonding layer 30, and thus, repeated descriptions thereof will be omitted to avoid redundancy.

The first insulation layer 51 may cover the first LED stack 23. In some exemplary embodiments, the first insulation layer 51 may also cover side surfaces of the first, second, and third LED stacks 23, 33, and 43. The first insulation layer 51 may be formed of a silicon oxide film or a silicon nitride film.

The electrode pads 101 (101a, 101b, 101c, and 101d) may be disposed on the first insulation layer 51. The electrode pads 101a, 101b, 101c, and 101d may be electrically connected to the first, second, and third LED stacks 23, 33, and 43 through the first insulation layer 51.

The cantilever electrodes 103 (103a, 103b, 103c, and 103d) are formed on the electrode pads 101a, 101b, 101c, and 101d, respectively. Each of the cantilever electrodes 103a, 103b, 103c, and 103d includes a fixed edge coupled to the electrode pads 101a, 101b, 101c, and 101d, and a free standing edge. The free standing edge is spaced apart from the electrode pads 101a, 101b, 101c, and 101d in the vertical direction. In this case, a predetermined space is provided between the electrode pads 101a, 101b, 101c, and 101d and the free standing edges of the cantilever electrodes to allow vertical movement of the free standing edges.

As shown in FIG. 4A, the cantilever electrodes 103a, 103b, 103c, and 103d are disposed to be electrically spaced apart from one another. The cantilever electrodes 103a, 103b, 103c, and 103d may be disposed to cross one another, but the inventive concepts are not limited thereto, and may be arranged in various ways. The free standing edges of the cantilever electrodes 103a, 103b, 103c, and 103d are connected to the pads 1003 of the circuit board (1001 in FIG. 3), and thus, the pads 1003 of the circuit board may be arranged corresponding to the arrangement of the free standing edges.

In one exemplary embodiment, all of the free standing edges of the cantilever electrodes 103a, 103b, 103c, and 103d may be disposed in regions of the first, second, and third LED stacks 23, 33, and 43. In another embodiment, the free standing edges may be located outside of the regions of the first, second, and third LED stacks 23, 33, and 43. As such, the pads 1003 disposed on the circuit board 1001 may be disposed further apart than the electrode pads 101a, 101b, 101c, and 101d.

Referring to FIG. 5, the cantilever electrode 103 may be formed of multiple-metal layers 113a, 113b, and 113c. For example, the first metal layer 113a and the second metal layer 113b may have different thermal expansion coefficients from each other, and accordingly, the free standing edge of the cantilever electrode 103 may be bent upward. Bending the free standing edge of the cantilever electrode 103 creates a sharp point that is connected to the pads 1003 of the circuit board 1001. As such, the sharp point of the free standing edge may scratch a surface of the pad 1003 to ensure electrical connection. In an exemplary embodiment, an angle between the upper surface of the cantilever electrode 103 and the side surface thereof, that is, an angle of the sharp point of the free standing edge may be variously changed according to a method of forming the cantilever electrode 103. For example, when the cantilever electrode 103 is formed using a plating technique, the angle of the sharp point may be approximately 90 degrees, and when using a lift-off technique after depositing a metal layer by electron beam evaporation, sputtering technique, or the like, the angle of the sharp point may be an obtuse angle that is greater than 90 degrees.

For bending of the cantilever electrode 103, a thermal expansion coefficient of the first metal layer 113a may be less than that of the second metal layer 113b. The first metal layer 113a and the second metal layer 113b may be selected from, for example, Ti, Ni, Co, Cu, Al, Pt, W, Cr, or the like. For example, the first metal layer 113a may be Ti, and the second metal layer 113b may be Ni. The third metal layer 113c may be formed to protect the surface of the cantilever electrode 103, and may be formed of Au, for example.

Referring to FIG. 6, the cantilever electrodes 103a, 103b, and 103c are electrically connected to anodes of the first, second, and third LED stacks 23, 33, and 43, respectively, and the cantilever electrodes 103d may be commonly connected to cathodes of the first, second, and third LED stacks 23, 33, and 43. To electrically connect the cantilever electrodes 103a, 103b, and 103c and the anodes of the first, second, and third LED stacks 23, 33, and 43, a transparent electrode may be formed on at least one of the second conductivity type semiconductor layers 23c, 33c, and 43c of the first, second, and third LED stacks 23, 33, and 43, for example.

Figure 7:
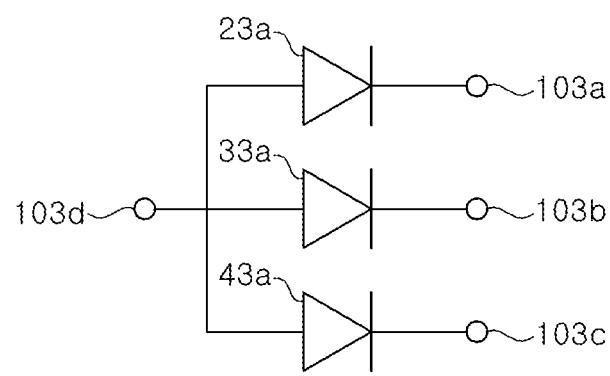
FIG. 7 is a schematic circuit diagram of a light emitting device according to another exemplary embodiment.

In the illustrated exemplary embodiment, although the cantilever electrodes 103d is described as being commonly connected to the cathodes of the first, second, and third LED stacks 23, 33, and 43, in some exemplary embodiments, the cantilever electrodes 103d may be commonly connected to the anodes of the first, second, and third LED stacks 23, 33, and 43, as shown in FIG. 7. In this case, the cantilever electrodes 103a, 103b, and 103c may be connected to the cathodes of the first, second, and third LED stacks 23, 33, and 43, respectively.

In this manner, the first, second, and third LED stacks 23, 33, and 43 may be individually driven by the cantilever electrodes 103a, 103b, 103c, and 103d.

Figure 8A:
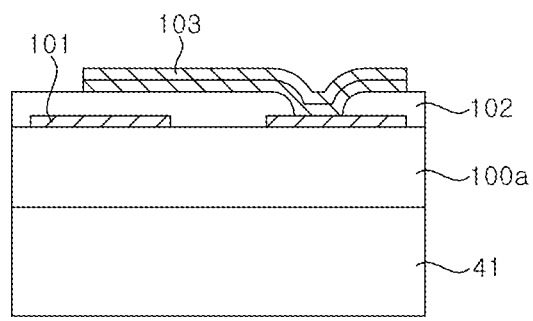
FIG. 8A and FIG. 8B are schematic cross-sectional views illustrating a method of manufacturing a light emitting device according to an exemplary embodiment.
Figure 8B:
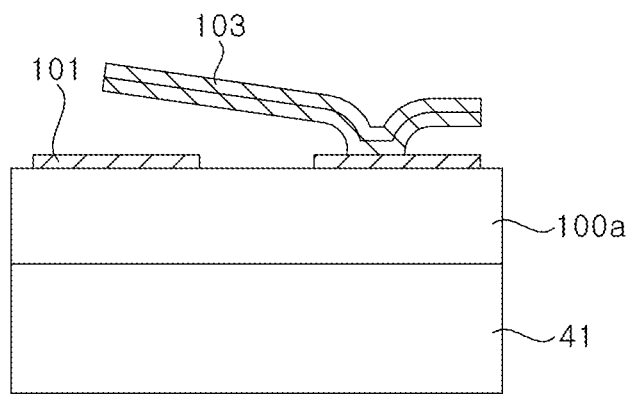

FIG. 8A and FIG. 8B are schematic cross-sectional views illustrating a method of manufacturing a light emitting device according to an exemplary embodiment.

Referring to FIG. 8A, a stack 100a of LED stacks (23, 33, and 43 of FIG. 4B) is formed on a substrate 41. The LED stacks 23, 33, and 43 may be bonded to one another by first and second bonding layers 30 and 40 (see FIG. 4B).

The substrate 41 may be a growth substrate for growing the LED stack 43, for example, a gallium nitride substrate, a SiC substrate, a sapphire substrate, or a patterned sapphire substrate.

In the illustrated exemplary embodiment, although a single stack 100a is exemplarily illustrated as being formed on the substrate 41, a plurality of stacks 100a may be formed on the substrate 41. The stack 100a may also include an insulation layer (51 in FIG. 4B).

Electrode pads 101 (101a, 101b, 101c, and 101d shown in FIG. 4A) are formed on the stack 100a. The electrode pads 101 are electrically connected to the LED stacks 23, 33, and 43. As shown in FIG. 4A, four electrode pads 101 may be formed on the single stack 100a.

Subsequently, a sacrificial layer 102 covering the electrode pads 101 is formed. The sacrificial layer 102 may be formed of a dielectric layer, such as $SiO_2$, or a photoresist layer. The sacrificial layer 102 has openings exposing the electrode pads 101. Although FIG. 8A only shows one opening exposing one of the electrode pads 101, openings may be formed on each of the electrode pads 101, respectively.

Thereafter, a cantilever electrode 103 is formed on the sacrificial layer 102 using a lift-off technique or deposition and etching techniques. For example, material layers for forming the cantilever electrode 103 may be deposited using electron beam deposition, sputtering, or plating techniques, and the cantilever electrode 103 may be formed on the sacrificial layer 102.

Referring to FIG. 8B, the sacrificial layer 102 is removed. In this case, the cantilever electrode 103 may be free from a restraint of the sacrificial layer 102 and bent upward. As described above, since the cantilever electrode 103 has a multiple-layer structure of metal layers having different thermal expansion coefficients, the cantilever electrode 103 may be adjusted to be bent upward.

In the illustrated exemplary embodiment, although the cantilever electrodes 103 are described as being formed on the stack 100a disposed on the growth substrate 41, in some exemplary embodiments, the cantilever electrodes 103 may be formed after the stack 100a formed on the growth substrate 41 is separated from the substrate 41 and transferred to another support substrate.

Figure 9A:
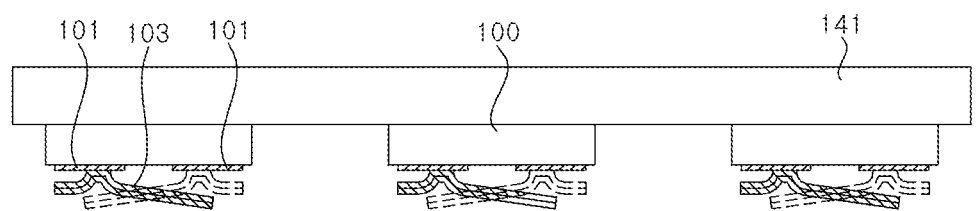
FIG. 9A, FIG. 9B, and FIG. 9C are schematic cross-sectional views illustrating a method of manufacturing a display panel according to an exemplary embodiment.
Figure 9B:
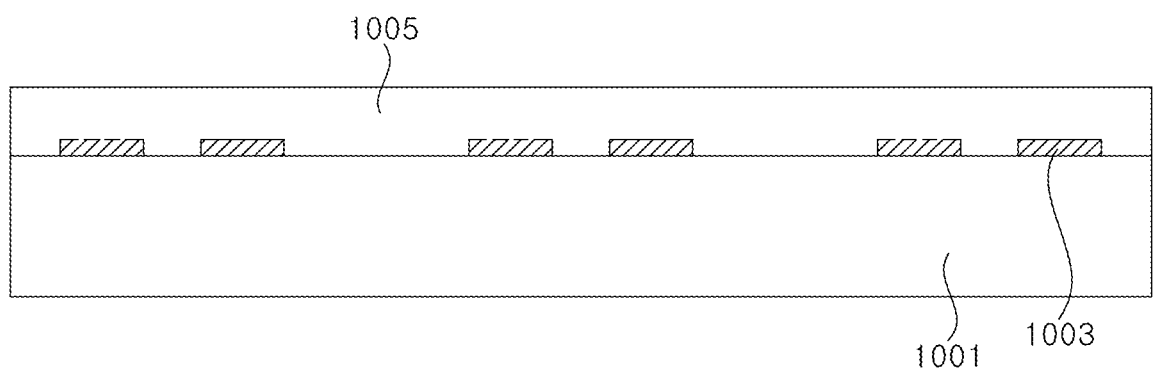
Figure 9C:
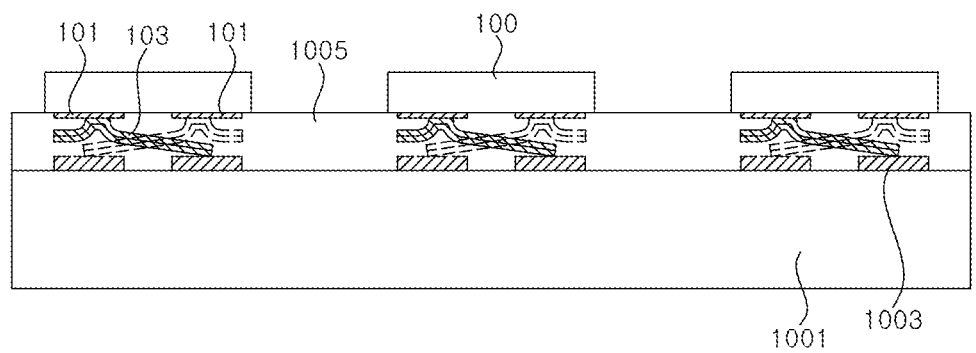

FIG. 9A, FIG. 9B, and FIG. 9C are schematic cross-sectional views illustrating a method of manufacturing a display panel according to an exemplary embodiment.

Referring to FIG. 9A, a plurality of light emitting devices 100 is arranged on a s support substrate 141. The light emitting devices 100 include cantilever electrodes 103. Since the light emitting device 100 is the same as that described with reference to FIGS. 4A and 4B, repeated descriptions thereof will be omitted to avoid redundancy.

The support substrate 141 may be a growth substrate (41 in FIG. 8A) for growing semiconductor layers 43a, 43b, and 43c of the third LED stack 43, but the inventive concepts are to not limited thereto, and the support substrate 141 may be a support substrate different from the substrate 41. For example, the light emitting devices 100 formed on the growth substrate 41 may be separated from the growth substrate 41 and transferred to the support substrate 141. The light emitting devices 100 may be arranged at a pixel interval on the support substrate 141.

Referring to FIG. 9B, a circuit board 1001 including pads 1003 in each pixel area is provided. The pads 1003 may be disposed to correspond to the free standing edges of the cantilever electrodes 103 of the light emitting device 100.

An adhesive layer 1005 is formed to cover the pads 1003. The adhesive layer 1005 may be formed of, for example, thermal curing or ultraviolet curing resin. The curing process of an adhesive material layer may be performed at a later stage.

Referring to FIG. 9C, the light emitting devices 100 arranged on the support substrate 141 are proceeded towards the circuit board 1001 such that the cantilever electrodes 103 are connected to the pads 1003. For example, the cantilever electrodes 103 may penetrate through the adhesive layer 1005 with a sharp point of the free standing edge, and the cantilever electrodes 103 are connected to the pads 1003.

In an exemplary embodiment, pressing the light emitting devices 100 toward the circuit board 1001 may cause the cantilever electrodes 103 to scrape upper surfaces of the pads 1003 to facilitate electrical connection. By pressing the light emitting devices 100, the cantilever s electrode 103 may be bent toward the light emitting device 100. In this case, a predetermined space may be secured between the free standing edge of the cantilever electrode 103 and the electrode pads 101 to prevent an electrical short circuit between the cantilever electrode 103 and the electrode pads 101.

Thereafter, the adhesive layer 1005 is cured to bond the light emitting devices 100 to the circuit board 1001. The adhesive layer 1005 may be cured by thermal curing or ultraviolet curing.

Subsequently, the support substrate 141 may be removed from the light emitting devices 100 to provide the display panel (1000 in FIG. 2). When the support substrate 141 is a growth substrate such as sapphire, the light emitting devices 100 may be separated from the is support substrate 141 using a laser lift-off technique. Alternatively, the light emitting devices 100 may be adhered to the support substrate 141 by an adhesive layer, and the support substrate 141 may be removed by separating the light emitting devices 100 from the adhesive layer.

According to the exemplary embodiments, the cantilever electrodes 103 formed on the light emitting devices 100 may facilitate transfer of the light emitting devices 100 to the circuit board 1001 with improved reliability, as compared to a conventional method of transferring light emitting devices using a solder or bump pad.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
   at least one LED stack configured to emit light;
   electrode pads disposed on the at least one LED stack and electrically connected to the at least one LED stack; and
   cantilever electrodes disposed on the electrode pads and electrically connected to the electrode pads, respectively,
   wherein each of the cantilever electrodes has a fixed edge that is fixed to one of the electrode pads and a free standing edge that is spaced apart from the one of the electrode pads.

2. The light emitting device of claim 1, wherein
   the free standing edge of the cantilever electrode is bent in a direction away from the at least one LED stack.

3. The light emitting device of claim 1, wherein the cantilever electrode includes at least two metal layers having different thermal expansion coefficients from each other.

4. The light emitting device of claim 1, wherein:
   the at least one LED stack comprises:
   a first LED stack, a second LED stack, and a third LED stack;
   a first bonding layer interposed between the first LED stack and the second LED stack; and
   a second bonding layer interposed between the second LED stack and the third LED stack;
   the first, second, and third LED stacks are configured to emit light having different wavelengths; and
   the electrode pads are electrically connected to the first, second, and third LED stacks to individually drive the first, second, and third LED stacks.

5. The light emitting device of claim 1, wherein the light emitting device has a width of about 10 μm or less.

6. A display panel, comprising:
   a circuit board having pads;
   light emitting devices electrically connected to the pads and arranged on the circuit board; and
   an adhesive layer disposed between the circuit board and the light emitting devices to adhere the circuit board and the light emitting devices, wherein:
   each of the light emitting devices comprises:
     at least one LED stack configured to emit light;
     electrode pads disposed on the at least one LED stack and electrically connected to the at least one LED stack; and
     cantilever electrodes disposed on the electrode pads and electrically connected to the electrode pads, respectively;
   each of the cantilever electrodes has a fixed edge that is fixed to one of the electrode pads and a free standing edge that is spaced from the one of the electrode pads; and
   the free standing edge is electrically connected to one of the pads of the circuit board.

7. The display panel of claim 6, wherein the light emitting devices are disposed at a pitch of about 50 μm or less.

8. The display panel of claim 6, wherein the light emitting devices are disposed at a pitch of about 10 μm or less.

9. The display panel of claim 6, wherein at least one free standing edge of the cantilever electrodes extends outwardly beyond an area of the at least one LED stack.

10. The display panel of claim 6, wherein the cantilever electrode includes at least two metal layers having different thermal expansion coefficients from each other.

11. The display panel of claim 10, wherein the metal layers include at least one of Ni, Co, Cu, Ti, Al, Ti, and Pt.

12. The display panel of claim 6, wherein:
    the at least one LED stack comprises:
    a first LED stack, a second LED stack, and a third LED stack;
    a first bonding layer interposed between the first LED stack and the second LED stack; and
    a second bonding layer interposed between the second LED stack and the third LED stack;
    the first, second, and third LED stacks are configured emit light having different wavelengths; and
    the electrode pads are electrically connected to the first, second, and third LED stacks to individually drive the first, second, and third LED stacks.

13. The display panel of claim 12, wherein the light emitting devices are configured to emit light generated from the first, second, and third LED stacks through the third LED stack.

14. The display panel of claim 13, wherein the third LED stack does not include a growth substrate.

15. The display panel of claim 12, wherein the adhesive layer partially covers a side surface of the light emitting device.

16. The display panel of claim 15, wherein the adhesive layer includes a curable resin.

17. A display apparatus, comprising:
    a display panel comprising:
      a circuit board having pads;
      light emitting devices electrically connected to the pads and arranged on the circuit board; and
      an adhesive layer disposed between the circuit board and the light emitting devices to adhere the circuit board and the light emitting devices, wherein:
    each of the light emitting devices comprises:
      at least one LED stack configured to emit light;
      electrode pads disposed on the at least one LED stack and electrically connected to the at least one LED stack; and
      cantilever electrodes disposed on the electrode pads and electrically connected to the electrode pads, respectively;
    each of the cantilever electrodes has a fixed edge that is fixed to one of the electrode pads and a free standing edge that is spaced from the one of the electrode pads; and
    the free standing edge is electrically connected to one of the pads of the circuit board.

18. The display apparatus of claim 17, wherein the light emitting devices are disposed at a pitch of about 10 μm or less.

19. The display apparatus of claim 17, wherein each of the cantilever electrodes includes at least two metal layers having different thermal expansion coefficients from each other.

20. The display apparatus of claim 17, wherein:
each of the light emitting devices includes a first LED stack, a second LED stack, and a third LED stack;
the first, second, and third LED stacks are configured to emit light having different wavelengths; and
the light emitting devices are configured to emit light generated from the first, second, and third LED stacks through the third LED stack.

* * * * *